US007554055B2

(12) United States Patent
Reiley et al.

(10) Patent No.: US 7,554,055 B2
(45) Date of Patent: Jun. 30, 2009

(54) METHOD FOR MAKING OHMIC CONTACT TO SILICON STRUCTURES WITH LOW THERMAL LOADS

(75) Inventors: Timothy Clark Reiley, San Jose, CA (US); Timothy Carl Strand, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 686 days.

(21) Appl. No.: 11/120,820

(22) Filed: May 3, 2005

(65) Prior Publication Data

US 2006/0249368 A1 Nov. 9, 2006

(51) Int. Cl.
*B23K 26/00* (2006.01)
*H01L 21/44* (2006.01)

(52) U.S. Cl. .......................... 219/121.66; 219/121.85; 438/662

(58) Field of Classification Search ............ 219/121.65, 219/121.66, 121.85; 438/662, 663, 522, 438/523

See application file for complete search history.

(56) References Cited

U.S. PATENT DOCUMENTS

| | | | |
|---|---|---|---|
| 4,261,764 A | 4/1981 | Narayan | |
| 4,526,468 A * | 7/1985 | Steigmeier et al. | 356/338 |
| 4,549,064 A * | 10/1985 | Delfino | 219/121.85 |
| 4,570,324 A | 2/1986 | Smith et al. | |
| 4,698,708 A | 10/1987 | Lazzari | |
| 5,200,970 A * | 4/1993 | Klopotek | 372/55 |
| 5,242,853 A * | 9/1993 | Sato et al. | 438/424 |
| 5,414,647 A * | 5/1995 | Ebenstein et al. | 702/167 |
| 5,449,640 A * | 9/1995 | Hunt et al. | 438/640 |
| 5,518,951 A * | 5/1996 | Paynter et al. | 438/50 |
| 5,739,982 A * | 4/1998 | Arya et al. | 360/234.5 |
| 5,879,447 A * | 3/1999 | Okada et al. | 117/8 |
| 5,955,154 A * | 9/1999 | Xuan et al. | 427/555 |
| 6,110,813 A | 8/2000 | Ota et al. | |

(Continued)

FOREIGN PATENT DOCUMENTS

JP    56006434    1/1981

(Continued)

OTHER PUBLICATIONS

H.S. Tan et al., "Comparative Study on the Production of Ohmic Contacts on Si by Pulsed Laser Irradiation and by Furnace Heating"; Singapore J. Phys.; vol. 3, No. 1, 1986, pp. 63-73.

(Continued)

*Primary Examiner*—Samuel M Heinrich
(74) *Attorney, Agent, or Firm*—Bracewell & Giuliani LLP

(57) ABSTRACT

An ohmic contact for a silicon slider body is disclosed. A scanned laser beam locally heats a metal film on the slider body to interdiffuse the metal and silicon while minimizing the total thermal load on the slider body. This localized heating avoids thermal damage to the sensitive magnetic head region on the slider. The native oxide layer on the slider is removed by a sputter etch, followed by deposition of a diffusion layer. A capping layer is then deposited to reduce oxidation during subsequent processing. The metal layer is then locally annealed by scanning the laser beam over the target area. Contact resistance of less than 100 ohms is achieved while minimizing the thermal load on the slider body.

10 Claims, 3 Drawing Sheets

U.S. PATENT DOCUMENTS

| | | | |
|---|---|---|---|
| 6,156,654 A * | 12/2000 | Ho et al. | 438/683 |
| 6,221,518 B1 * | 4/2001 | Araki et al. | 428/811.2 |
| 6,255,005 B1 * | 7/2001 | Yokoyama et al. | 428/683 |
| 6,365,446 B1 * | 4/2002 | Chong et al. | 438/197 |
| 6,589,609 B1 * | 7/2003 | Pan et al. | 427/554 |
| 6,607,945 B2 * | 8/2003 | Tsui | 438/132 |
| 6,764,951 B1 * | 7/2004 | van Ngo | 438/687 |
| 6,770,508 B2 | 8/2004 | Nakashima et al. | |
| 7,193,193 B2 * | 3/2007 | Bergstrom et al. | 219/635 |
| 2003/0214763 A1 | 11/2003 | Childress et al. | |
| 2006/0145145 A1 * | 7/2006 | Nishio | 257/40 |

FOREIGN PATENT DOCUMENTS

| | | |
|---|---|---|
| JP | 56087345 | 7/1981 |
| JP | 59028335 | 2/1984 |
| JP | 59086218 | 5/1984 |
| JP | 4188723 | 7/1992 |
| JP | 7273060 | 10/1995 |
| JP | 2003220490 A * | 8/2003 |

OTHER PUBLICATIONS

"Ohmic Contacts to GaAs"; IBM Technical Disclosure Bulletin, Aug. 1982, p. 1194.

J.P. Lazzari et al.; "A New Thin Film Head Generation IC Head"; IEEE Transactions on Magnetics; vol. 25, No. 5, Sep. 1989.

Chen Cunli et al; "Laser Irradiation Metallization of Al-Si Ohmic Contact", Chinese Journal of Semiconductors, vol. 4, No. 5, pp. 502-506.

C. Hill; "Proceedings of the Technical Programme of Internepcon U.K."; International Electronic Packaging and Production Conferences; pp. 328-332.

M. Finetti et al., "Multi-Scan Electron Beam Sintering of Al-Si Ohmic Contacts"; Solid-State Electronics; vol. 24, No. 6, pp. 539-543.

* cited by examiner

METHOD FOR MAKING OHMIC CONTACT TO SILICON STRUCTURES WITH LOW THERMAL LOADS

BACKGROUND OF THE INVENTION

1. Technical Field

The present invention relates in general to metal-semiconductor interfaces and, in particular, to an improved system, method, and apparatus for making ohmic contact to silicon structures, such as silicon magnetic recording sliders, with low thermal loads and localized processing.

2. Description of the Related Art

In hard disk drives, magnetic recording heads are normally built upon a ceramic substrate on which an air bearing is formed so that the head can be flown over a disk surface. This ceramic substrate is called the slider body. The slider body is bonded by means of an adhesive layer to a stainless steel suspension which is then mounted on an actuator to enable the recording head to access all points on the disk recording surface. It is necessary to have a conductive path from the slider through the suspension to ground in order to avoid excessive tribocharging of the slider body. The ceramic substrate normally used for magnetic recording heads is sufficiently conductive that this requirement can be met by using a conductive adhesive for bonding the slider body to the conductive suspension.

Recently, there has been interest in using silicon for the slider body. This material presents a problem for establishing a conductive path to ground since an asymmetric conducting Schottky barrier is normally formed at a metal-semiconductor interface. Broadly speaking, the Schottky barriers have relatively low resistance for one polarity of voltage but a relatively high resistance for the opposite polarity of voltage, and the resistance is a nonlinear function of voltage for both polarities. This barrier may be overcome by providing an "ohmic contact." An ideal ohmic contact has a resistance that is independent of voltage.

Special procedures must be used to achieve good ohmic contact between silicon and a metal. See, e.g., E. H. Rhoderick, *Metal-Semiconductor Contacts*, Oxford University Press, 1978. Typically, such procedures involve depositing an appropriate metal layer or layers on a silicon surface that has the native oxide layer removed. The workpiece is then annealed in an oven at elevated temperatures (e.g., 500° C. for 10 minutes). Unfortunately, subjecting the entire device to high temperature processing of this magnitude would destroy the sensitive magnetic recording heads in slider bodies. Thus, another solution for improving interfaces between metals and semiconductors in slider bodies would be desirable.

SUMMARY OF THE INVENTION

One embodiment of a system, method, and apparatus for forming an ohmic contact on a silicon slider body is disclosed. The process uses a scanned laser beam to locally heat a metal film on the slider body. This provides the required interdiffusion of the metal and the silicon while minimizing the total thermal load on the slider body. The temperatures at the sensitive magnetic head region are kept below 100° C., which avoids thermal damage to the magnetic head. The range of processing temperatures is normally much higher for silicon devices than is allowable for completed magnetic heads or some MEMS devices.

The sliders are mounted in a carrier that leaves at least a portion of the back sides (i.e., the side away from the disk surface in the drive) of the slider bodies exposed. In one embodiment, the carrier is a standard high-temperature polymer (e.g., polyetherimide) cleaning tray that has been pre-metallized to prevent outgassing. The carriers containing the exposed sliders are placed in a vacuum sputter deposition system. Initially, the native oxide layer is removed by a sputter etch, followed by deposition of a diffusion layer (e.g., a 400 Å layer of NiCr). For example, NiCr alloy compositions of 80% Ni and 20% Cr, or 60% Ni and 40% Cr may be used. However, a wide range of alloy compositions may be used, ranging from about 5% Cr to 100% Cr. A capping layer (e.g., a 400 Å layer of Ru) is then deposited to reduce oxidation during subsequent processing steps.

The sliders are then subjected to a laser processing system to locally anneal the metal layer. For example, the laser processing system may utilize a pulsed Nd:Ylf laser emitting a wavelength of 1047 nm in 100 ns pulses at pulse energies of 60 µJ and focused beam spot sizes having 30 µm diameters. The laser beam is scanned over the area to be annealed such that the film is irradiated multiple times to enhance the annealing effect. Using this process, a low resistance contact (e.g., less than 100 ohms) that is independent of polarity can be achieved while minimizing the thermal load on the slider body and keeping the temperature of the recording head below 100° C. Furthermore, the area to be processed can be defined by the laser scanning system without relying on photolithographic processes.

Beyond the application of this ohmic contact approach for silicon sliders is the more general application to silicon structures, such as MEMS devices or other active silicon devices that could make use of backside ohmic contacts. Such contacts may be formed after the devices are otherwise completed. For example, a backside ground contact may be prepared after wafer thinning.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the invention, as well as others which will become apparent are attained and can be understood in more detail, more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

DETAILED DESCRIPTION OF THE INVENTION

Referring to FIGS. 1-4, various embodiments of a system, method, and apparatus constructed in accordance with the present invention are shown. For example, one embodiment of the invention is a system for forming an ohmic contact on a workpiece 11. The workpiece 11 may comprise a semiconductor (e.g., silicon), such as that used to form the slider body for a magnetic read/write head in hard disk drive applications. The magnetic read/write head is a thermally sensitive component and is typically contained within the slider body.

Figure 1:
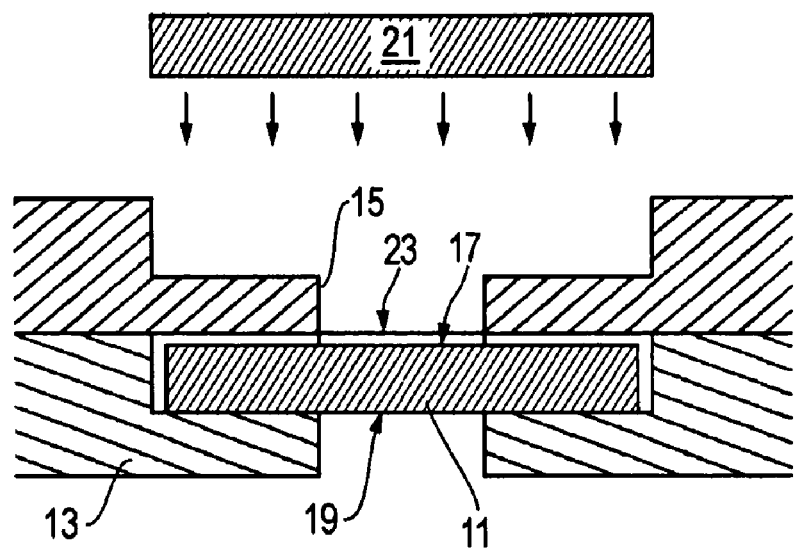
FIG. 1 is a sectional side view of one embodiment of a film forming system constructed in accordance with the present invention.
Figure 2A:
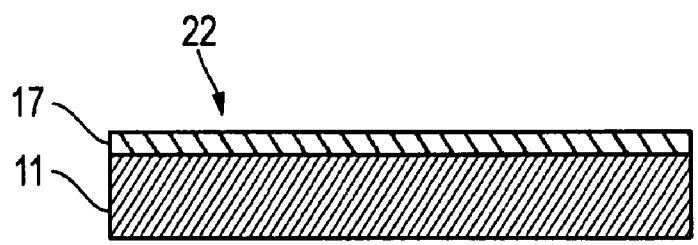
FIGS. 2a and 2b are sectional side views of one embodiment of a workpiece processed by the system of FIG. 1 and is constructed in accordance with the present invention.
Figure 2B:
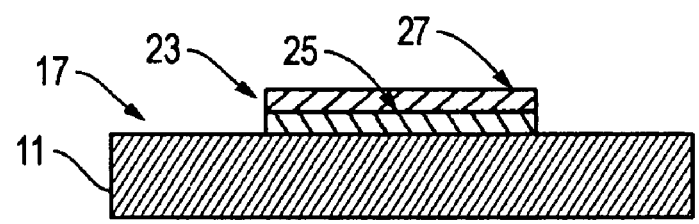
Figure 3:
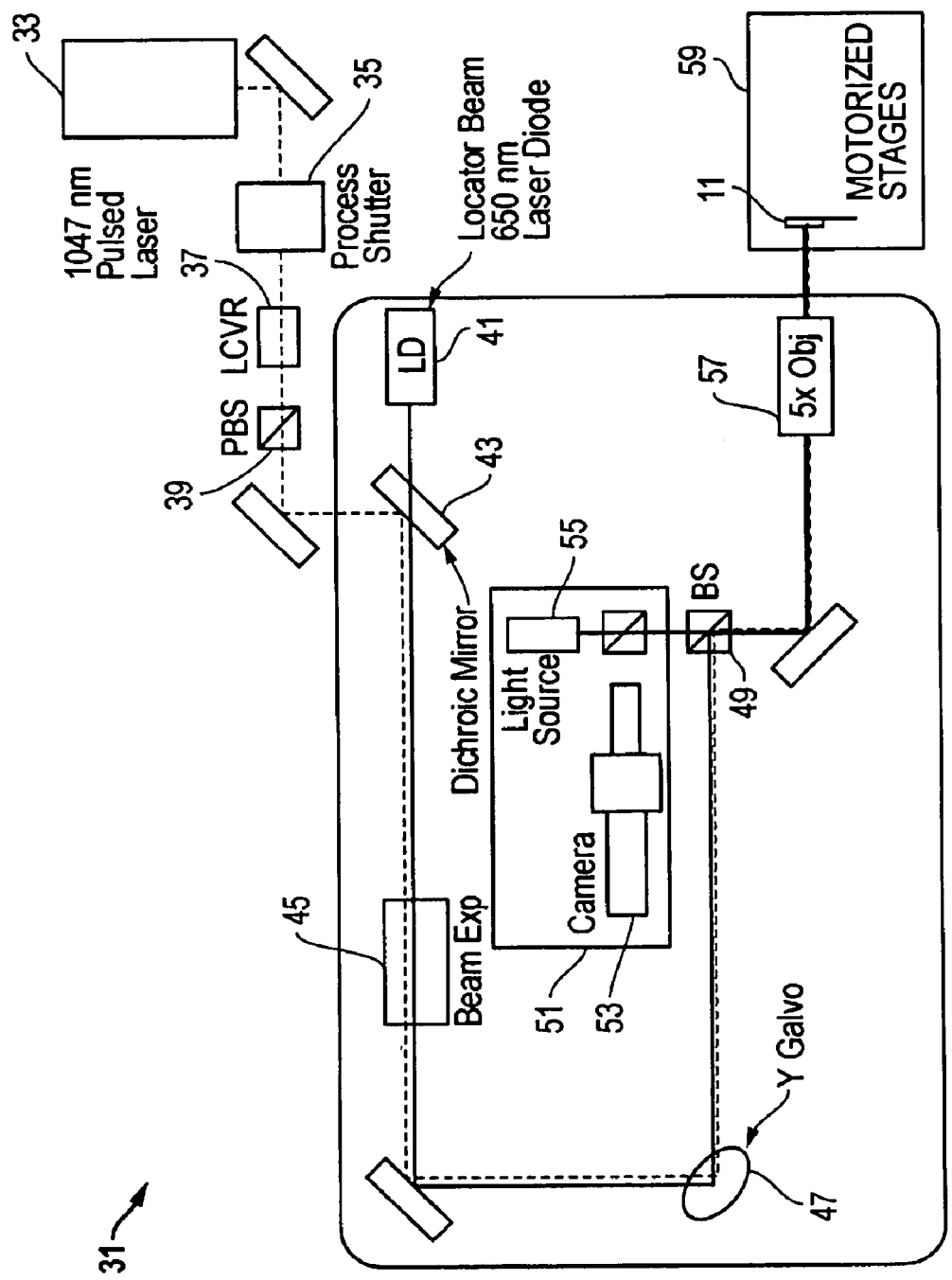
FIG. 3 is a schematic diagram of one embodiment of a localized heating system constructed in accordance with the present invention.
Figure 4:
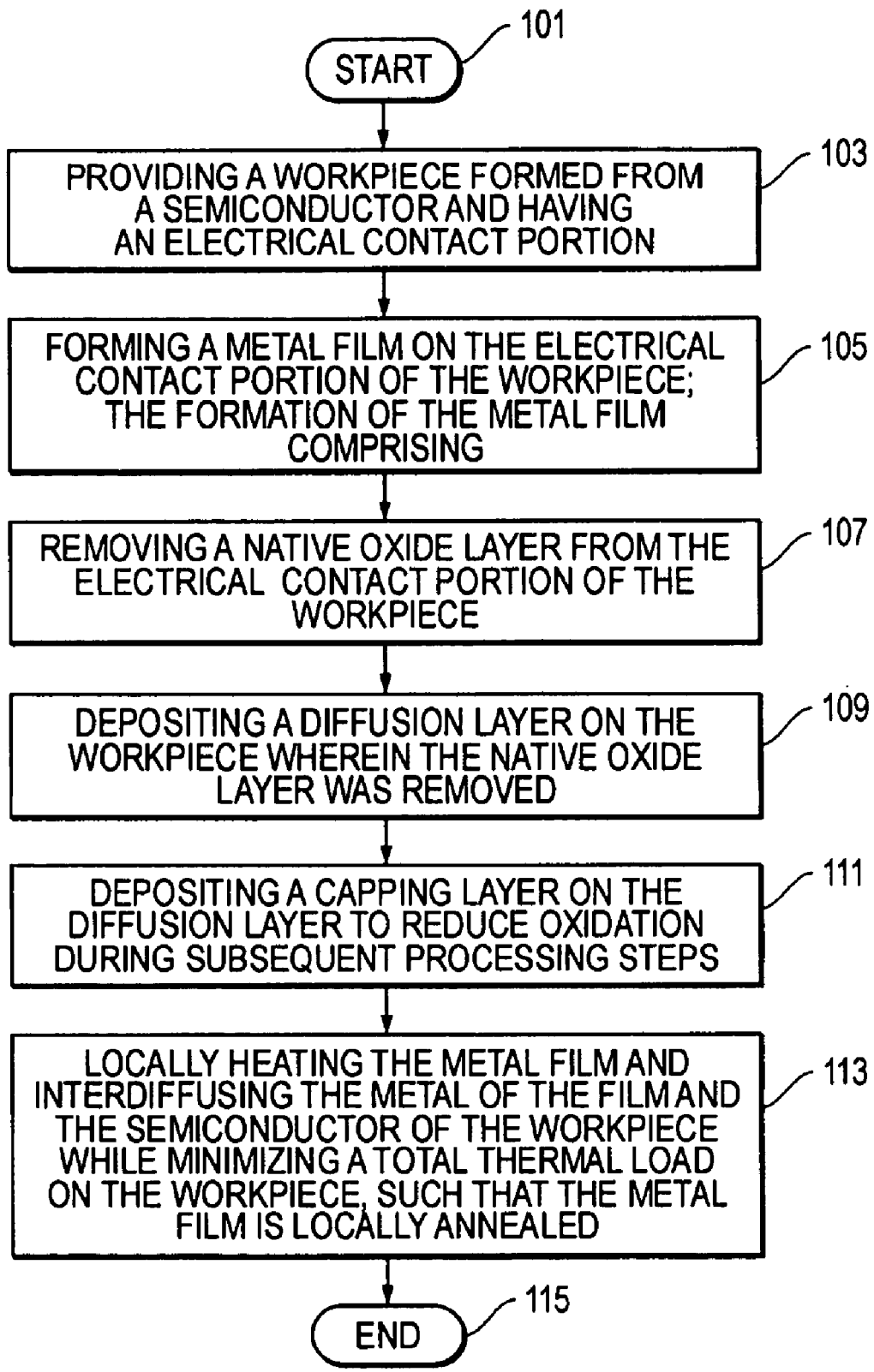
FIG. 4 is a high level from diagram of one embodiment of a method constructed in accordance with the present invention.

As shown in FIG. 1, the workpiece 11 may be mounted in and supported by a carrier 13, such as a conventional cleaning tray having upper and lower portions. When the workpiece 11 is properly seated in the carrier 13, an opening 15 formed in the carrier 13 exposes at least a portion 17 of the workpiece 11 for subsequent processing. In the case of a slider body 11, the opening 15 in the carrier 13 exposes a side 17 of the slider body 11 that is opposite an air bearing surface 19 of the slider body 11. The carrier 13 is used to assist in defining an electrical contact target or portion 17 on the workpiece 11. The carrier 13 may be formed from a high-temperature polymer that has been pre-metallized to prevent outgassing.

A film forming system 21, such as a vacuum sputter deposition system, is used to form a film 23 (e.g., metal film) on the target 17 of the workpiece 11 through the opening 15 in the carrier 13. In one embodiment (e.g., FIGS. 2a and 2b), the film forming system 21 initially removes a native oxide layer 22 of the workpiece 11 by a sputter etch, deposits a diffusion layer 25, and deposits a capping layer 27 to reduce oxidation during subsequent processing steps.

The diffusion layer 25 may comprise a thin film (50 to 1000 Å) of Al, Cu, NiCr or many other metals, usually transition metals that form silicides with Si. The capping layer 27 may comprise a thin film (e.g., 50 to 1000 Å) of Au, NiCr, Ru, or more noble metals, preferably having high absorption at the wavelength of the laser being used for annealing. In one embodiment, the diffusion layer 25 comprises 400 Å of Al, Cu, or NiCr, and the capping layer 27 may comprise 400 Å of Au, NiCr, or Ru.

In addition, a localized heating system 31, such as a laser processing system (see, e.g., FIG. 3), is used to locally heat the metal film 23 on the workpiece 11. The laser interdiffuses a material of the film and a material of the workpiece while minimizing a total thermal load on the workpiece, such that the laser processing system locally anneals the film on the workpiece without damaging the thermally sensitive component (e.g., head) of the workpiece.

In one embodiment, the laser processing system comprises a pulsed Nd:Ylf laser that emits a wavelength of 1047 nm in 100 ns pulses at pulse energies of 60 μJ and focused beam spot sizes having 30 μm diameters. A laser beam of the laser processing system may be scanned over the annealed film such that the film is irradiated multiple times to enhance the annealing effect. A temperature of the thermally sensitive component (e.g., head) of the workpiece is kept below 100° C. to avoid thermal damage thereto. In addition, a contact resistance between the workpiece and the film is less than 100 ohms.

In the particular embodiment illustrated (which is merely representative of the present invention), the pulsed laser 33 emits a beam that passes through a process shutter 35, a liquid-crystal light valve (LCVR) 37 and a polarizing beam-splitter (PBS) 39. The LCVR 37 and PBS 39 together control the laser power delivered to the workpiece 11. A low power, visible beam locator 41 passes with the main beam through a dichroic mirror 43 to a beam expander 45, a galvanometer scanning mirror 47, a beam splitter 49, and a 5× microscope objective lens 57 before striking the target 17 on film 23 on the workpiece 11. The workpiece 11 may be mounted to motorized stages 59. A vision system 51 utilizes a camera 53 and light source 55 to provide a real-time image of the workpiece 11 through beam splitter 49 and objective 57 for alignment and process control purposes.

The present invention also comprises a method of forming a low resistance contact on a workpiece. Starting as indicated at step 101, the method comprises providing a workpiece formed from a semiconductor and having an electrical contact portion (step 103); forming a metal film on the electrical contact portion of the workpiece (step 105); the formation of the metal film comprising: removing a native oxide layer from the electrical contact portion of the workpiece (step 107); depositing a diffusion layer on the workpiece wherein the native oxide layer was removed (step 109); depositing a capping layer on the diffusion layer to reduce oxidation during subsequent processing steps (step 111); and then locally heating the metal film and interdiffusing the metal of the film and the semiconductor of the workpiece while minimizing a total thermal load on the workpiece, such that the metal film is locally annealed (step 113); before ending as indicated at step 115.

The method may comprise using a scanned laser beam for locally heating the metal film on the workpiece. The method may further comprise supporting the workpiece with a carrier having an opening formed therein for exposing the electrical contact portion of the workpiece; and the carrier may be formed from a high-temperature polymer that has been pre-metallized to prevent outgassing.

A vacuum sputter deposition system may be used to perform the various film processing steps. For example, the method may comprise removing the native oxide layer by sputter etch, depositing 400 Å of NiCr, and depositing 400 Å of Ru. The heating step may comprise pulsing a Nd:Ylf laser emitting a wavelength of 1047 nm in 100 ns pulses at pulse energies of 60 μJ and focused beam spot sizes having 30 μm diameters. The heating step also may comprise scanning a laser beam over the annealed metal film such that the metal film is irradiated multiple times to enhance the annealing effect; and/or forming a contact resistance between the workpiece and the metal film of less than 100 ohms, while keeping a temperature in a thermally sensitive region of the workpiece below 100° C. to avoid thermal damage thereto.

While the invention has been shown or described in only some of its forms, it should be apparent to those skilled in the art that it is not so limited, but is susceptible to various changes without departing from the scope of the invention. For example, other applications of this ohmic contact approach for silicon sliders are readily applied to more general applications for silicon structures (e.g., MEMS devices or other active silicon devices) that may utilize ohmic contacts, which may be formed after the devices are otherwise completed.

What is claimed is:

1. A method of forming a low resistance contact on a workpiece, the method comprising:
   (a) providing a workpiece formed from a semiconductor and having an electrical contact portion;
   (b) forming a metal film on the electrical contact portion of the workpiece; the formation of the metal film comprising:

(c) removing a native oxide layer from the electrical contact portion of the workpiece;
(d) depositing a diffusion layer on the workpiece where the native oxide layer was removed;
(e) depositing a capping layer on the diffusion layer to reduce oxidation during subsequent processing steps; and then
(f) locally heating the metal film with a scanned laser beam to locally heat the metal film on the workpiece and interdiffusing the metal of the film and the semiconductor of the workpiece while minimizing a total thermal load on the workpiece, such that the metal film is locally annealed, while keeping a temperature in a thermally sensitive region of the workpiece below 100° C. to avoid thermal damage thereto.

2. A method according to claim 1, further comprising supporting the workpiece with a carrier having an opening formed therein for exposing the electrical contact portion of the workpiece, wherein the carrier is formed from a high temperature polymer that has been pre-metallized to prevent outgassing.

3. A method according to claim 1, wherein steps (b) though (e) comprise using a vacuum sputter deposition system.

4. A method according to claim 1, wherein step (c) comprises removing the native oxide layer by sputter etch, step (d) comprises depositing 50 to 1000 Å of a material selected from the group consisting of Al, Cu, and NiCr, and step (e) comprises depositing 50 to 1000 Å of a material selected from the group consisting of Au, NiCr, and Ru.

5. A method according to claim 1, wherein step (f) comprises pulsing a Nd:Ylf laser emitting a wavelength of 1047 nm in 100 ns pulses at pulse energies of 60 μJ and focused beam spot sizes having 30 μm diameters.

6. A method according to claim 1, wherein step (f) comprises scanning a laser beam over the annealed metal film such that the metal film is irradiated multiple times to enhance the annealing effect.

7. A method according to claim 1, further comprising forming a contact resistance between the workpiece and the metal film of less than 100 ohms.

8. A method according to claim 1, wherein step (a) comprises defining the electrical contact portion with a laser scanning system without relying on photolithographic processes.

9. A method according to claim 1, wherein steps (b) through (e) comprise using a vacuum sputter deposition system.

10. A method of forming a low resistance contact on a workpiece, the method comprising:
(a) providing a workpiece formed from a semiconductor and having an electrical contact portion defined with a laser scanning system without relying on photolithographic processes, and supporting the workpiece with a carrier having an opening formed therein for exposing the electrical contact portion of the workpiece, the carrier being formed from a high temperature polymer that has been pre-metallized to prevent outgassing;
(b) forming a metal film on the electrical contact portion of the workpiece, and forming a contact resistance between the workpiece and the metal film of less than 100 ohms; the formation of the metal film comprising:
(c) removing a native oxide layer by sputter etch from the electrical contact portion of the workpiece;
(d) depositing a diffusion layer on the workpiece where the native oxide layer was removed, the diffusion layer comprising 50 to 1000 Å of a material selected from the group consisting of Al, Cu, and NiCr;
(e) depositing a capping layer on the diffusion layer to reduce oxidation during subsequent processing steps, the capping layer comprising 50 to 1000 Å of a material selected from the group consisting of Au, NiCr, and Ru; and then
(f) locally heating the metal film with a scanned laser beam to locally heat the metal film on the workpiece and interdiffusing the metal of the film and the semiconductor of the workpiece while minimizing a total thermal load on the workpiece, such that the metal film is locally annealed, the heating comprising pulsing a Nd:Ylf laser emitting a wavelength of 1047 nm in 100 ns pulses at pulse energies of 60 μJ and focused beam spot sizes having 30 μm diameters, and scanning the laser beam over the annealed metal film such that the metal film is irradiated multiple times to enhance the annealing effect, while keeping a temperature in a thermally sensitive region of the workpiece below 100° C. to avoid thermal damage thereto.

* * * * *